United States Patent
Yano et al.

(10) Patent No.: US 8,304,359 B2
(45) Date of Patent: *Nov. 6, 2012

(54) SPUTTERING TARGET, TRANSPARENT CONDUCTIVE FILM, AND TRANSPARENT ELECTRODE FOR TOUCH PANEL

(75) Inventors: Koki Yano, Sodegaura (JP); Kazuyoshi Inoue, Sodegaura (JP); Nobuo Tanaka, Sodegaura (JP); Tokie Tanaka, legal representative, Sodegaura (JP); Yukio Shimane, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 12/088,027

(22) PCT Filed: Sep. 25, 2006

(86) PCT No.: PCT/JP2006/318930
§ 371 (c)(1),
(2), (4) Date: Jul. 29, 2009

(87) PCT Pub. No.: WO2007/037191
PCT Pub. Date: Apr. 5, 2007

(65) Prior Publication Data
US 2009/0308635 A1 Dec. 17, 2009

(30) Foreign Application Priority Data

Sep. 27, 2005 (JP) ................. 2005-279818

(51) Int. Cl.
*C04B 35/453* (2006.01)
*C23C 14/34* (2006.01)

(52) U.S. Cl. ............ 501/126; 501/134; 252/519.5; 252/520.1; 204/298.13

(58) Field of Classification Search .......... 501/126, 501/134; 252/519.5, 520.1; 204/298.13
See application file for complete search history.

(56) References Cited

U.S. PATENT DOCUMENTS

| 5,972,527 | A | 10/1999 | Kaijou et al. |
| 6,534,183 | B1* | 3/2003 | Inoue ................... 428/432 |
| 6,669,830 | B1* | 12/2003 | Inoue et al. ........ 204/298.13 |
| 6,689,477 | B2* | 2/2004 | Inoue ................... 428/432 |

(Continued)

FOREIGN PATENT DOCUMENTS
JP  6-234565 A  8/1994
(Continued)

OTHER PUBLICATIONS

G.B. Palmer et al., "$ZN_{2-x}SN_{1-x}IN_{2x}O_{4-}$: An Indium-Substituted Spinal With Transparent Conducting Properties", Journal of Solid State Chemistry, vol. 134, (1997) pp. 192-197.

*Primary Examiner* — Karl Group
(74) *Attorney, Agent, or Firm* — Oblon, Spivak, McClelland, Maier & Neustadt, L.L.P.

(57) ABSTRACT

A sputtering target which is composed of a sintered body of an oxide containing indium, tin and zinc as main components; the atomic ratio of In/(In+Sn+Zn) being 0.10 to 0.35; the atomic ratio of Sn/(In+Sn+Zn) being 0.15 to 0.35; and the atomic ratio of Zn/(In+Sn+Zn) being 0.50 to 0.70; and containing a hexagonal layered compound shown by $In_2O_3(ZnO)_m$, wherein m is an integer of 3 to 9, and a spinel structure compound shown by $Zn_2SnO_4$.

14 Claims, 1 Drawing Sheet

U.S. PATENT DOCUMENTS

| | | | |
|---|---|---|---|
| 6,998,070 B2 * | 2/2006 | Inoue et al. | 252/519.51 |
| 2010/0170696 A1 * | 7/2010 | Yano et al. | 174/126.2 |
| 2010/0266787 A1 * | 10/2010 | Yano et al. | 428/1.1 |

FOREIGN PATENT DOCUMENTS

| | | | |
|---|---|---|---|
| JP | 6-236711 A | | 8/1994 |
| JP | 10-83719 A | | 3/1998 |
| JP | 2000-256061 A | | 9/2000 |
| JP | 2000256059 | * | 9/2000 |
| JP | 2000256060 | * | 9/2000 |
| JP | 2006-210033 A | | 8/2006 |
| WO | WO 01/38599 A1 | | 5/2001 |

* cited by examiner

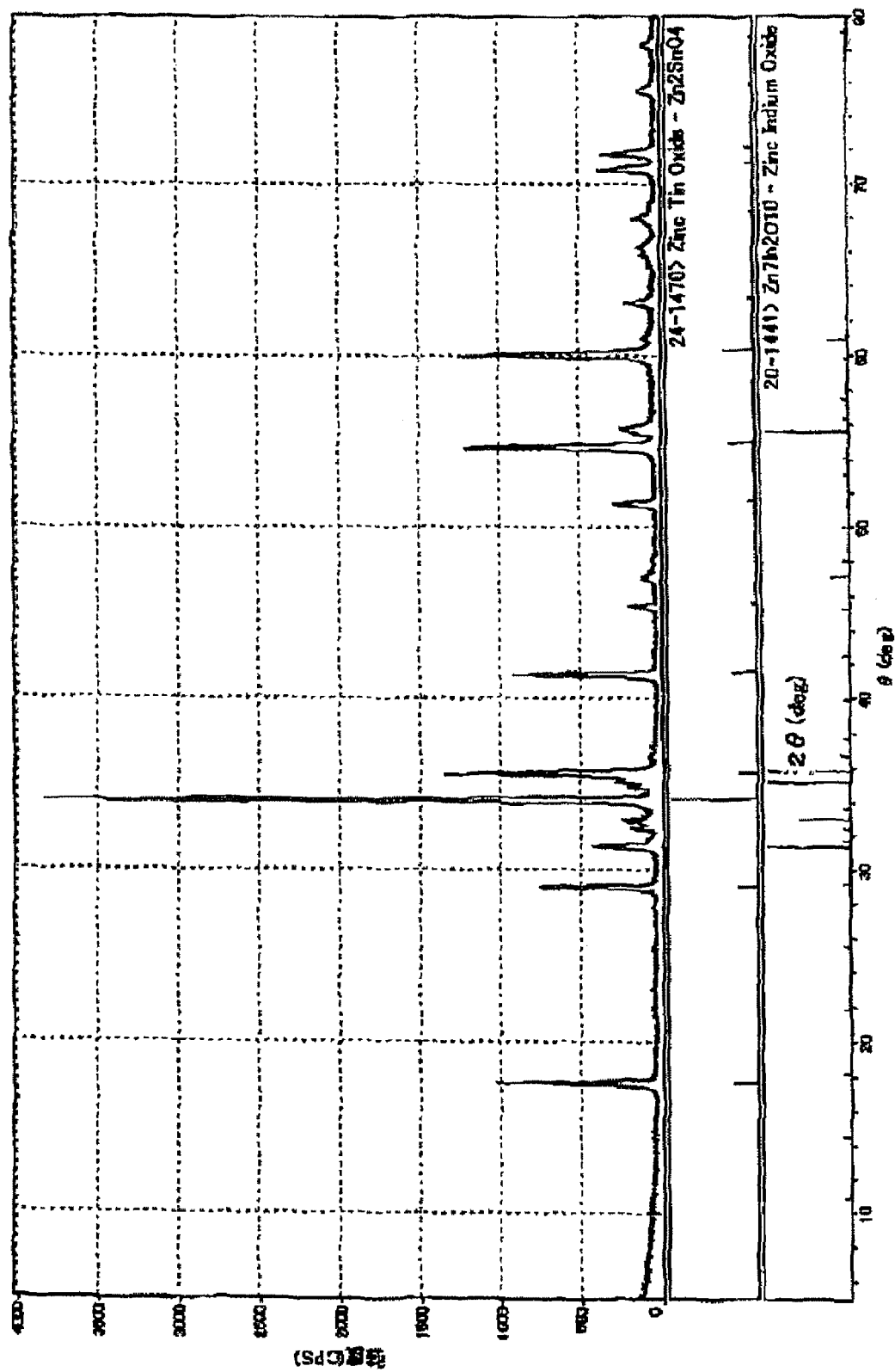

SPUTTERING TARGET, TRANSPARENT CONDUCTIVE FILM, AND TRANSPARENT ELECTRODE FOR TOUCH PANEL

TECHNICAL FIELD

The invention relates to a sputtering target having a reduced indium content, a transparent conductive film, and a transparent electrode for touch panels.

BACKGROUND

In recent years, development of displays has been remarkable. Liquid crystal displays (LCD), electroluminescence displays (EL), field emission displays (FED), or the like are used as display devices for business machines such as personal computers and word processors, and display devices for control systems in factories. These displays have a sandwich structure in which a display device is held between transparent conductive oxides.

A mainstream material for such a transparent conductive oxide is indium tin oxide (hereinafter occasionally abbreviated as "ITO") prepared by a sputtering method, an ion plating method, or a vapor deposition method as described in Non-Patent Document 1.

ITO is composed of indium oxide and tin oxide, possesses excellent transparency and conductivity, can be etched with a strong acid, and exhibits high adhesion to a substrate. IZO has the same properties as those of ITO. In addition, IZO is excellent in etchability with a weak acid, and a highly minute electrode can be obtained from IZO.

Recently, due to the rapid popularization of flat panel displays (FPDs), there are increasing concerns about the supply shortage of indium which is the major raw material of transparent electrodes and indispensable for FPDs. As compared with zinc and tin, indium may have hazardous properties. In view of such potential hazardous properties, restriction in the amount of indium used has been desired. A target for a transparent conductive film such as ITO and IZO has a high indium content (80 to 90 atomic percent). Under such circumstances, reduction in the amount of indium in an ITO or IZO target has been strongly desired.

As for a target composed of IZO, to prevent generation of nodules and suppress abnormal electrical discharge, incorporation of a hexagonal layered compound of $In_2O_3(ZnO)_m$, wherein m is an integer of 2 to 20, with a crystal grain diameter of 5 μm or less has been investigated (Patent Documents 1 and 2).

Patent Document 1: WO01/038599
Patent Document 2: JP-A-06-234565
Non-Patent Document 1: "Technology of Transparent Conductive Film" edited by The 166th Committee of Transparent Oxide and Photoelectron Material, Japan Society for Promotion of Science, Ohmsha, Ltd. (1999)

An object of the invention is to provide a high-density, low-resistance target with a reduced amount of indium, as well as a transparent conductive film and a transparent electrode for touch panels prepared using this target.

SUMMARY OF THE INVENTION

If IZO of which the indium content has been reduced to 35 atomic percent or less is sintered at high temperatures to increase density, the resulting target has a significantly high resistance. That is, in a target formed of IZO, increasing relative density and lowering bulk resistance cannot be attained simultaneously, and therefore, reduction of the indium content is difficult.

As a result of extensive studies, the inventors have found that, if IZO having an indium content of 35 atomic percent or less is sintered at high temperatures to increase density, a significantly high-resistance hexagonal layered compound in which the number of ZnO is large ($In_2O_3(ZnO)_m$ in which m is 10 or more) is generated. The inventors have also found that, by using a sintered body of an oxide containing a hexagonal layered compound shown by $In_2O_3(ZnO)_m$, wherein m is an integer of 3 to 9 and a spinel structure compound shown by $Zn_2SnO_4$, it is possible to produce a target having a high relative density and a low bulk resistance, even if the amount of indium is reduced to 35% or less.

The invention provides the following sputtering target or the like.

1. A sputtering target which is composed of a sintered body of an oxide comprising indium, tin and zinc as main components;
   the atomic ratio of In/(In+Sn+Zn) being 0.10 to 0.35;
   the atomic ratio of Sn/(In+Sn+Zn) being 0.15 to 0.35; and
   the atomic ratio of Zn/(In+Sn+Zn) being 0.50 to 0.70; and
   comprising a hexagonal layered compound shown by $In_2O_3(ZnO)_m$, wherein m is an integer of 3 to 9, and a spinel structure compound shown by $Zn_2SnO_4$.
2. The sputtering target according to 1, wherein, in an X-ray diffraction, the maximum peak intensity ($I(In_2O_3(ZnO)_m)$) of the hexagonal layered compound, the maximum peak intensity ($I(Zn_2SnO_4)$) of the spinel structure compound, and the maximum peak intensity ($I(SnO_2)$) of a rutile structure compound shown by $SnO_2$ satisfy the following relationship:

$$(I(In_2O_3(ZnO)_m))/(I(Zn_2SnO_4))<1$$

$$(I(SnO_2))/(I(In_2O_3(ZnO)_m))<1$$

$$(I(SnO_2))/(I(Zn_2SnO_4))<1$$

3. The sputtering target according to 1 or 2, wherein, in an X-ray diffraction, the peak of the spinel structure compound shifts toward the narrow angle side.
4. The sputtering target according to any one of 1 to 3, which has a bulk resistance of 0.5 to 300 mΩcm.
5. The sputtering target according to any one of 1 to 4, which has a relative density of 90% or more.
6. A transparent conductive film, which is formed by sputtering the sputtering target according to any one of 1 to 5.
7. A transparent electrode for a touch panel, which is formed by using the transparent conductive film according to 6.

According to the invention, a high-density, low-resistance target with a reduced indium content, as well as a transparent conductive film and a transparent electrode for touch panels prepared using this target can be provided.

BRIEF DESCRIPTION OF DRAWINGS

The figure is an X-ray diffraction chart of a sputtering target obtained in Example 1.

BEST MODE FOR CARRYING OUT THE INVENTION

The sputtering target of the invention is composed of a sintered body of an oxide comprising indium, tin and zinc as main components and comprising a hexagonal layered compound shown by $In_2O_3(ZnO)_m$, wherein m is an integer of 3 to 9, and a spinel structure compound shown by $Zn_2SnO_4$.

This oxide may contain, in addition to the hexagonal layered compound and the spinel structure compound, a bixbyite structure, a wurtzite structure compound and a rutile structure compound. Further, insofar as the advantageous effects of the invention are not impaired, in addition to indium, tin and zinc, the sputtering target of the invention may also contain aluminum, gallium, magnesium, boron, germanium, niobium, molybdenum, tungsten, yttrium, antimony, hafnium, tantalum, calcium, beryllium, strontium, cesium and lanthanoids.

The target of the invention preferably has an atomic ratio of In/(In+Sn+Zn) in a range of 0.10 to 0.35, preferably in a range of 0.11 to 0.29, more preferably 0.12 to 0.24, and particularly preferably 0.14 to 0.24.

If the atomic ratio of In/(In+Sn+Zn) is less than 0.10, the target may have a low relative density and a high bulk resistance. If more than 0.35, indium reduction may be insufficient.

The target of the invention preferably has an atomic ratio of Sn/(In+Sn+Zn) in a range of 0.15 to 0.35, preferably 0.18 to 0.34, and more preferably 0.20 to 0.33. If the atomic ratio is outside of the above-mentioned range, there is a possibility that the hexagonal layered structure compound of $In_2O_3(ZnO)_m$, wherein m is an integer of 3 to 9, and the spinel structure compound of $Zn_2SnO_4$ cannot be included in the target at the same time, and the target may have an increased bulk resistance.

The target of the invention preferably has an atomic ratio of Zn/(In+Sn+Zn) in a range of 0.50 to 0.70, preferably 0.51 to 0.69, and more preferably 0.52 to 0.65. If the atomic ratio is outside of the above-mentioned range, there is a possibility that the hexagonal layered structure compound of $In_2O_3(ZnO)_m$, wherein m is an integer of 3 to 9, and the spinel structure compound of $Zn_2SnO_4$ cannot be included in the target at the same time, and the target may have an increased bulk resistance.

In the sputtering target of the invention, in an X-ray diffraction (XRD), it is preferred that the maximum peak intensity of the hexagonal layered compound of $In_2O_3(ZnO)_m$ ($I(In_2O_3(ZnO)_m)$), the maximum peak intensity of the spinel structure compound of $Zn_2SnO_4$ ($I(Zn_2SnO_4)$), and the maximum peak intensity of the rutile structure compound of $SnO_2$ ($I(SnO_2)$) satisfy the following relationship:

$(I(In_2O_3(ZnO)_m))/(I(Zn_2SnO_4))<1$ $(I(SnO_2))/(I(In_2O_3(ZnO)_m))<1$ $(I(SnO_2))/(I(Zn_2SnO_4))<1$

It is preferred that $(I(In_2O_3(ZnO)_m))/(I(Zn_2SnO_4))$ be smaller than 0.3. Outside the above-mentioned range, the target may have an increased bulk resistance.

In the sputtering target of the invention, it is preferable that the peak (2θ) of the spinel structure compound of $Zn_2SnO_4$ shifts toward the narrow angle side (minus direction) in an X-ray diffraction (XRD). The shift amount is preferably 0.01° or more, more preferably 0.02° or more, and particularly preferably 0.03° or more.

If the shift angle is smaller than 0.01°, there is a possibility that carrier generation is insufficient and the target resistance increases. The reason appears to be that a sufficient amount of carrier electrons are not produced due to an insufficient amount (the number of atoms) of other atoms solid-dissolved in $Zn_2SnO_4$.

The bulk resistance of the sputtering target of the invention is preferably 0.5 to 300 mΩcm, more preferably 0.6 to 200 mΩcm, still more preferably 0.7 to 150 mΩcm, and particularly preferably 0.8 to 100 mΩcm.

If the bulk resistance is lower than 0.5 mΩcm, electric carriers may be generated to cause abnormal electrical discharge due to the difference in resistance between the fragments adhered to the target as dusts and the target. If the bulk resistance exceeds 300 mΩcm, DC sputtering may not be performed stably.

The relative density of the sputtering target of the invention is preferably 90% or more, more preferably 95% or more, still more preferably 98% or more, and particularly preferably 99% or more.

If the relative density is smaller than 90%, there is a possibility that the film forming speed is retarded and the target strength is lowered.

The transparent conductive film of the invention can be formed by sputtering the above-mentioned sputtering target.

The specific resistance of the transparent conductive film is preferably 1 to 100 mΩcm, more preferably 2 to 10 mΩcm. The film thickness is preferably 10 to 1000 nm, more preferably 50 to 600 nm, and particularly preferably 100 to 400 nm.

Normally, it is preferred that a transparent electrode have a specific resistance as low as possible. However, it is preferred that the resistance of a transparent conductive film for use in touch panels be high to some extent. The transparent conductive film of the invention having the above-mentioned specific resistance is particularly suited for use as a transparent electrode for touch panels.

The transparent conductive film of the invention can also be used in semiconductor applications including TFTs (thin film transistors) by controlling carrier density, for example, by adjusting the oxygen differential pressure during film formation, or subjecting to a heat treatment in the presence of oxygen after film formation.

The etching rate when a formed transparent conductive film is etched by using an oxalic acid-based etching solution at 35° C. is usually 20 to 1,000 nm/min, preferably 30 to 300 nm/min, and particularly preferably 50 to 200 nm/min. If less than 20 nm/min, not only the tact time is retarded, but etching residues may remain on the resulting transparent electrode. An etching rate of more than 1,000 nm/min may be too fast to control the line width and the like.

Next, a method for producing the sputtering target of the invention will be described.

The method for producing the sputtering target normally comprises the steps of mixing raw materials, subjecting the mixture to pressure molding to obtain a molded product, and firing the molded product.

For example, known methods as those disclosed in JP-A-2002-069544, JP-A-2004-359984, and Japanese Patent No. 03628554 can be used.

A hexagonal layered compound shown by $In_2O_3(ZnO)_m$, wherein m is an integer of 3 to 9, can be produced by adjusting the amount of indium, tin and zinc.

A preferred example of the method for producing the sputtering target is given below.

(1) Mixing Step

It is preferable to homogeneously mix and pulverize the metal oxides as the raw material for producing the target using a common mixer such as a wet ball mill or a bead mill or using an ultrasonic device.

In this step, mixing is performed such that the atomic ratio of In/(In+Sn+Zn) be 0.10 to 0.35, the atomic ratio of Sn/(In+Sn+Zn) be 0.15 to 0.35, and the atomic ratio of Zn/(In+Sn+Zn) be 0.50 to 0.70.

(2) Prefiring

After the mixture of the indium compound, the zinc compound and the tin compound is obtained, it is preferable to fire the mixture in a prefiring step optionally provided. In this step of prefiring, it is preferable to conduct a heat treatment at 500 to 1,200° C. for 1 to 100 hours.

The reason for this is that, if the temperature is lower than 500° C. or the period of heat treatment is less than one hour, thermal decomposition of the indium compound, the zinc compound, or the tin compound may be insufficient. If the temperature is higher than 1,200° C. or the period of heat treatment is more than 100 hours, the resulting particles may become too large.

Therefore, it is particularly preferable to heat-treat (prefire) the mixture at a temperature in a range of 800 to 1,200° C. for 2 to 50 hours.

The prefired body obtained in this step is preferably pulverized before molding and firing. The pulverization is preferably carried out by using a ball mill, a roll mill, a pearl mill, a jet mill, or the like so that the prefired body has a particle diameter in a range of 0.01 to 1.0 μm.

(3) Molding Step

Next, it is preferable to mold the prefired product into a form suitable as a target in the molding step.

Although die molding, cast molding, injection molding, and the like can be given as the method for molding that can be used in this step, it is preferable to perform a cold isostatic press (CIP) molding or the like, followed by sintering, which is described later, in order to obtain a sintered body with a high sintered density.

A mold assistant agent such as polyvinyl alcohol, methyl cellulose, poly wax, and oleic acid may be used in the molding process.

(4) Firing Step

Next, after granulating the resulting powder, the granulated product is molded into a desired form by press-molding, and fired. The firing can be carried out by hot isostatic press (HIP) firing and the like.

In this case, the firing is normally carried out at a temperature usually of 1,100° to 1,700° C., preferably 1,200° to 1,600° C., and more preferably 1,300° to 1,500° C. for usually 30 minutes to 360 hours, preferably 8 to 180 hours, and more preferably 12 to 96 hours. Normally, firing is carried out in an oxygen atmosphere or under an oxygen pressure. If the powder mixture is fired in an atmosphere not containing oxygen gas or at a temperature higher than 1,700° C., there is a possibility that Sn and an Sn compound vaporize to damage a kiln or a hexagonal layered compound $(In_2O_3(ZnO)_m)$ with an m value of 10 or more may be generated. If the firing temperature is less than 1,100° C., there is a possibility that crystal forms may not be produced, the sintered body density of the target may not be increased, the target resistance may increase, and strength may decrease.

The heating rate in this step is 5° to 600° C./hour (preferably 50° to 500° C./hour, and more preferably 100° to 400° C./hour). If the heating rate is more than 600° C./hour, a hexagonal layered compound may be produced, leading to insufficient formation of spinel crystals. The heating rate of less than 5° C./hour is too slow for production and may impair productivity.

The cooling rate in this step is 5° to 600° C./hour (preferably 50° to 500° C./hour, and more preferably 100° to 400° C./hour). If the cooling rate is more than 600° C./hour, a hexagonal layered compound may be produced, leading to insufficient formation of spinel crystals. The cooling rate of less than 5° C./hour is too slow for production and may impair productivity.

(5) Reducing Step

A reducing treatment is preferably performed in a reducing step optionally provided in order to uniform the bulk resistance of the entire sintered body obtained in the firing step.

As examples of the reducing method used in this step, a method of using a reducing gas, a method of reducing by firing under vacuum, a method of reducing in an inert gas, and the like can be given.

In the case of the method of using a reducing gas, hydrogen, methane, carbon monoxide or a mixture of these gases with oxygen may be used. In the case of reduction by firing in an inert gas, nitrogen, argon, or a mixture of these gases with oxygen may be used.

The reducing treatment is carried out at 100° to 800° C., and preferably 200° to 800° C., for 0.01 to 10 hours, and preferably 0.05 to 5 hours.

(6) Working Step

In a working step, the sintered body thus obtained by sintering is preferably cut into a form suitable for mounting on a sputtering apparatus or attached with a mounting jig such as a backing plate. The thickness of the target is usually 2 to 20 mm, preferably 3 to 12 mm, and particularly preferably 4 to 6 mm. It is possible to attach two or more targets to one backing plate to obtain a single target in substance. The surface is preferably finished using a No. 80 to 4,000 diamond wheel, and particularly preferably using a No. 100 to 1,000 diamond wheel. If a diamond wheel smaller than No. 80 is used, the target may be easily cracked. To increase the strength of the target, it is preferred that grinding be performed in the longitudinal direction of the target.

EXAMPLES

Example 1

(1) Production of Sputtering Target

As raw materials, indium oxide with an average particle diameter of 1 μm and a purity of 4N, zinc oxide with an average particle diameter of 1 μm and a purity of 4N, and tin oxide with an average particle diameter of 1 μm and a purity of 4N were mixed at atomic ratios of In/(In+Sn+Zn)=0.16, Sn/(In+Sn+Zn)=0.20, and Zn/(In+Sn+Zn)=0.64. The mixture was supplied to a wet-type ball mill and pulverized for 20 hours to obtain a raw material fine powder.

The resulting mixture slurry was removed, filtered, dried and granulated. The granulated product was then molded by the cold isostatic pressing at a pressure of 294 MPa. The molded product was placed in a firing kiln, and fired at 1400° C. for 48 hours under an oxygen gas pressure, whereby a sintered body (target) was obtained. The heating rate was 50° C./hour until the temperature reached 1,000° C. Between 1,000° C. and 1,400° C., the heating rate was 150° C./hour. The cooling rate was 100° C./hour.

(2) Evaluation of Sputtering Target

The relative density and the bulk resistance of the resulting target were measured by the Archimedes principle and the four probe method, respectively. As a result, it was found that the target had a relative density of 99% and a bulk resistance of 80 mΩcm. The deflecting strength of the target was measured according to JIS R1601.

The crystal state in the transparent conductive material was observed by the X-ray diffraction method using a sample collected from the sintered body. As a result, the hexagonal layered compound of $In_2O_3(ZnO)_7$, the spinel structure compound of $Zn_2SnO_4$ and the bixbyite structure compound of $In_2O_3$ were observed in the resulting target.

FIG. 1 shows the results of the X-ray diffraction analysis. As shown in FIG. 1, the peak of the spinel structure compound shifted by 0.05° to the narrow angle side.

The measuring conditions of the X-ray-diffraction measurement of the target were as follows.
Device: "Ultima-III" manufactured by Rigaku Corp.
X rays: Cu—Kα ray (wavelength; 1.5406 Å, monochromized by a graphite monochromator)
2θ-θ reflection method, continuous scan (1.0°/min)
Sampling interval: 0.02°
Slit DS, SS: ⅔°, RS: 0.6 mm Furthermore, the sintered body was buried in a resin, and the surface was ground using alumina particles with a particle diameter of 0.05 μm and observed by an electron probe micro analyzer (EPMA) ("JXA-8621MX" manufactured by JEOL Ltd.) to measure the diameter of each crystal particle observed in a 30 μm×30 μm square frame on the surface of the sintered body. The average value of the particle diameters measured in the same manner in three frames was calculated to confirm that, in the sintered body, the crystal grain diameter of each of the hexagonal layered compound of $In_2O_3(ZnO)_3$ and the bixbyite structure compound of $In_2O_3$ was 20 μm or less.

The sintered body obtained in (1) above was cut and processed with a No. 400 diamond wheel to prepare a sputtering target with a diameter of about 10 cm and a thickness of about 5 mm. The surface roughness was measured by the AFM method. As a result, the surface roughness of Ra of the ground surface was found to be 0.3 μm.

(3) Preparation of Transparent Conductive Oxide

The sputtering target obtained in (1) above was mounted on a DC magnetron sputtering apparatus to prepare a transparent conductive film on a glass plate at room temperature.

The sputtering was carried out under the conditions of a sputtering pressure of $1\times10^{-1}$ Pa, an ultimate pressure of $5\times10^{-4}$ Pa, a substrate temperature of 200° C., electrical power of 120 W, and a film forming time of 15 minutes.

As a result, a transparent conductive oxide film with a thickness of about 100 nm was formed on the glass substrate.

(4) Evaluation of Transparent Conductive Oxide

The electric conductivity of the transparent conductive film on the glass obtained above was measured by the four probe method to show that the specific resistance was 3 mΩ/cm.

The transparent conductive film was subjected to X-ray diffraction analysis in the same manner as in (2) and confirmed to be amorphous. To evaluate smoothness of the film surface, the P-V value (according to JIS B0601) was measured to indicate that the P-V value was 5 nm, indicating good smoothness.

To evaluate transparency of the transparent conductive oxide, transmission of a light with a wavelength of 500 nm was measured with a spectrophotometer to confirm that the light transmission was 88%, indicating excellent transparency of the film.

Furthermore, the transparent conductive film was etched with a typical oxalic acid-based etching solution (oxalic acid concentration: 5 wt %) at 35° C. to show that the etching rate was 100 nm/min. After a 200% over-etching, etching scars were observed by means of an electron scan microscope (SEM). Only a small amount of etching residues were left.

(5) Occurrence of Abnormal Electrical Discharge

To monitor occurrence of abnormal electrical discharge, sputtering was performed continuously for 240 hours under the same conditions as those mentioned in (2) above, except that the sputtering target obtained in (1) was placed in a DC magnetron sputtering apparatus and a mixed gas obtained by adding 3% hydrogen gas to argon gas was used. Occurrence of abnormal electrical discharge was not observed at all.

Example 2 and Comparative Examples 1 to 4

The target and the transparent conductive film were prepared and evaluated in the same manner as in Example 1, except that the amount ratio of the raw materials was adjusted such that the atomic ratios shown in Table 1 can be obtained. The results are shown in Table 1 and Table 2. As for sputtering, RF magnetron sputtering was used in Comparative Examples 1, 3 and 4.

TABLE 1

|  |  |  | Example | | Comparative Example | | | |
|---|---|---|---|---|---|---|---|---|
|  |  |  | 1 | 2 | 1 | 2 | 3 | 4 |
| Atomic ratio | In/(In + Sn + Zn) | | 0.16 | 0.16 | 0.16 | 0.16 | 0.16 | 0.04 |
|  | Sn/(In + Sn + Zn) | | 0.20 | 0.30 | 0.84 | | 0.42 | 0.23 |
|  | Zn/(In + Sn + Zn) | | 0.64 | 0.54 | | 0.84 | 0.42 | 0.73 |
| Conditions | Sintering temperature | ° C. | 1400 | 1400 | 1400 | 1400 | 1400 | 1400 |
|  | Sintering time | Hours | 48 | 48 | 48 | 48 | 48 | 48 |
| X-ray diffraction | Crystal form | $In_2O_3$ | Yes | | Yes | | Yes | |
|  |  | $Zn_2SnO_4$ | Yes | Yes | | | | Yes |
|  |  | $SnO_2$ | | | Yes | | Yes | |
|  |  | ZnO | | | | Yes | | Yes |
|  |  | $In_2O_3(ZnO)_7$ | Yes | Yes | | | | |
|  |  | $In_2O_3(ZnO)_{17}$ | | | | Yes | Yes | Yes |
|  |  | $Sn_3In_4O_{12}$ | | | | Yes | | |
|  | Maximum peak intensity ratio | $I(In_2O_3(ZnO)_m)/I(Zn_2SnO_4)$ | 0.15 | 0.1 | | | | 0.3 |
|  |  | $I(SnO_2)/I(Zn_2SnO_4)$ | 0 | 0 | | | | |
|  |  | $I(SnO_2)/I(In_2O_3(ZnO)_m)$ | 0 | 0 | | | 0.6 | |
| Physical properties of target | Relative density | % | 99 | 93 | 72 | 82 | 79 | 81 |
|  | Bulk resistance | Ωcm | 0.08 | 0.23 | 30000 | 0.5 | 17000 | 300 |
|  | Deflecting strength | kg/mm² | 11 | 10 | 7 | 8 | 8 | 8 |
|  | Crystal diameter | μm | 20 or less | 20 or less | | | | |
|  | Surface roughness | μm | 0.3 | 0.3 | | | | |

TABLE 2

| | | | Example | | Comparative Example | | | |
|---|---|---|---|---|---|---|---|---|
| | | | 1 | 2 | 1 | 2 | 3 | 4 |
| Sputtering status | Abnormal electrical discharge | Not occurred/ Occurred | Not occurred | Not occurred | Occurred | Not occurred | Not occurred | Not occurred |
| Film properties | Specific resistance | mΩcm | 3 | 3 | 5 | 3 | 3 | 3 |
| | Film thickness | nm | about 100 | about 100 | about 100 | about 100 | about 100 | about 100 |
| | Crystal form | X-ray diffraction | Amorphous | Amorphous | Micro-Crystalline | Amorphous | Amorphous | Amorphous |
| | Smoothness | nm | 5 | 5 | 5 | 5 | 5 | 5 |
| | Light transmittance | % | 88 | 87 | 85 | 86 | 85 | 84 |
| | Etching with oxalic acid | nm/min, 35° C. | 100 | 30 | Not soluble | 100000 | 5 | 60 |
| | Amount of etching residues | Small/Large | Small | Small | Large | Small | Large | Small |

Industrial Applicability

The transparent conductive film formed by using the sputtering target of the invention is suitable for use as a transparent electrode used in displays such as liquid displays, touch panels, and solar cells.

The invention claimed is:

1. A sputtering target which is composed of a sintered body of an oxide comprising indium, tin and zinc as main components;
the atomic ratio of In/(In+Sn+Zn) being 0.10 to 0.35;
the atomic ratio of Sn/(In+Sn+Zn) being 0.15 to 0.35; and
the atomic ratio of Zn/(In+Sn+Zn) being 0.50 to 0.70;
and comprising a hexagonal layered compound shown by $In_2O_3(ZnO)_m$, wherein m is an integer of 3 to 9, and a spinet structure compound shown by $Zn_2SnO_4$ and wherein, in an X-ray diffraction, the maximum peak intensity ($I(In_2O_3(ZnO)_m)$) of the hexagonal layered compound, the maximum peak intensity ($I(Zn_2SnO_4)$) of the spinel structure compound, and the maximum peak intensity ($I(SnO_2)$) of a rutile structure compound shown by $SnO_2$ satisfy the following relationship:

$$(I(In_2O_3(ZnO)_m))/(I(Zn_2SnO_4))<1$$

$$(I(SnO_2))/(I(In_2O_3(ZnO)_m))<1$$

$$(I(SnO_2))/(I(Zn_2SnO_4))<1.$$

2. The sputtering target according to claim 1, wherein, in an X-ray diffraction, the peak of the spinel structure compound shifts toward the narrow angle side.

3. The sputtering target according to claim 1, which has a bulk resistance of 0.5 to 300 mΩcm.

4. The sputtering target according to claim 1, which has a relative density of 90% or more.

5. The sputtering target according to claim 1, wherein
the atomic ratio of In/(In+Sn+Zn) being 0.16;
the atomic ratio of Sn/(In+Sn+Zn) being 0.20 to 0.30; and
the atomic ratio of Zn/(In+Sn+Zn) being 0.54 to 0.64.

6. The sputtering target according to claim 1, wherein
the atomic ratio of In/(In+Sn+Zn) being 0.16;
the atomic ratio of Sn/(In+Sn+Zn) being 0.20; and
the atomic ratio of Zn/(In+Sn+Zn) being 0.64.

7. The sputtering target according to claim 1, wherein
the atomic ratio of In/(In+Sn+Zn) being 0.16;
the atomic ratio of Sn/(In+Sn+Zn) being 0.30; and
the atomic ratio of Zn/(In+Sn+Zn) being 0.54.

8. The sputtering target according to claim 1, which has been prepared by a process comprising a firing step having a heating rate of 5° C./hr to 600° C./hr to achieve a sintered target.

9. The sputtering target according to claim 1, which has been prepared by a process comprising a firing step having a heating rate of 50° C./hr to 500° C./hr to achieve a sintered target.

10. The sputtering target according to claim 1, which has been prepared by a process comprising a firing step having a heating rate of 100° C./hr to 400° C./hr to achieve a sintered target.

11. The sputtering target according to claim 1, which has been prepared by a process comprising a firing step having a heating rate of 50° C./hr until the temperature reaches 1,000° C., and a heating rate of 150° C./hr between 1,000° C. and 1,400° C.

12. The sputtering target according to claim 1, wherein, in an X-ray diffraction, the peak of a rutile structure compound ($SnO_2$) is not observed.

13. The sputtering target according to claim 1, wherein the atomic ratio of Sn/(In+Sn+Zn) being 0.15 to 0.20.

14. The sputtering target according to claim 1, wherein m is 7.

* * * * *